(12) United States Patent
Carter et al.

(10) Patent No.: US 8,085,093 B2
(45) Date of Patent: Dec. 27, 2011

(54) DIFFERENTIALLY COMPENSATED INPUT PAIR

(75) Inventors: Nathan Carter, Santa Clara, CA (US); JoAnn Close, Los Altos, CA (US); Vikram Garg, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/629,294

(22) Filed: Dec. 2, 2009

(65) Prior Publication Data

US 2011/0128077 A1    Jun. 2, 2011

(51) Int. Cl.
*H03F 3/45* (2006.01)

(52) U.S. Cl. .......................................... 330/259

(58) Field of Classification Search .................. 330/259, 330/290
See application file for complete search history.

(56) References Cited

U.S. PATENT DOCUMENTS

| 4,362,956 | A | * | 12/1982 | Ogasawara et al. | 327/354 |
| 4,959,622 | A | * | 9/1990 | Kearney | 330/257 |
| 6,963,244 | B1 | | 11/2005 | Carter | |
| 7,719,361 | B2 | * | 5/2010 | Pera | 330/260 |

* cited by examiner

*Primary Examiner* — Steven J Mottola
(74) *Attorney, Agent, or Firm* — Kenyon & Kenyon LLP

(57) ABSTRACT

The invention is directed to an amplifier including an absolute value circuit. The absolute value circuit may be driven by differential potentials and may include a first pair of transistors modulating a tail current of the amplifier when a differential input voltage goes high, and a second pair of transistors modulating the tail current of the amplifier when a differential input voltage goes low.

16 Claims, 11 Drawing Sheets

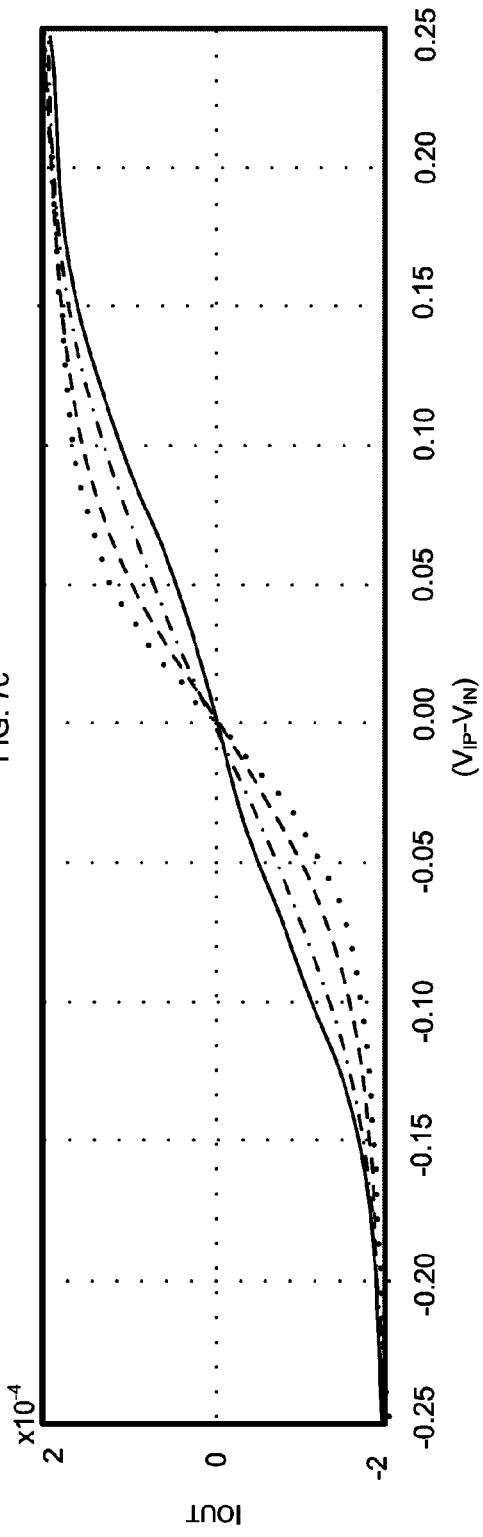
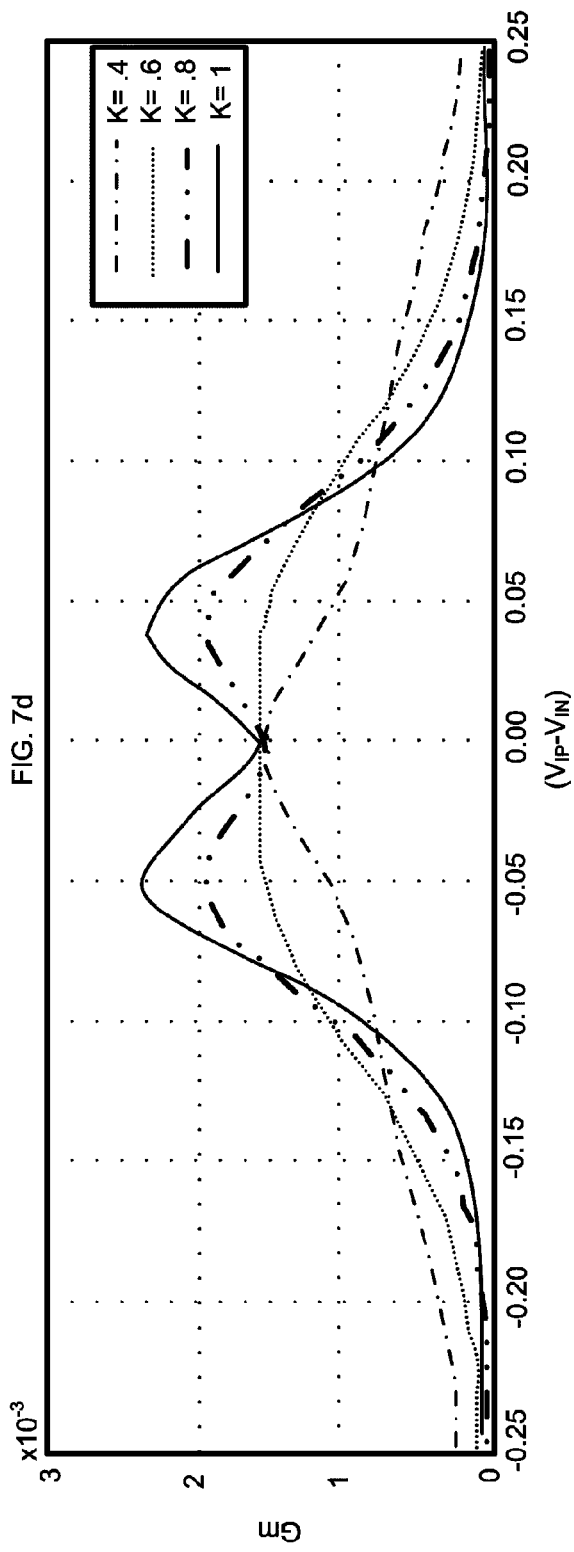

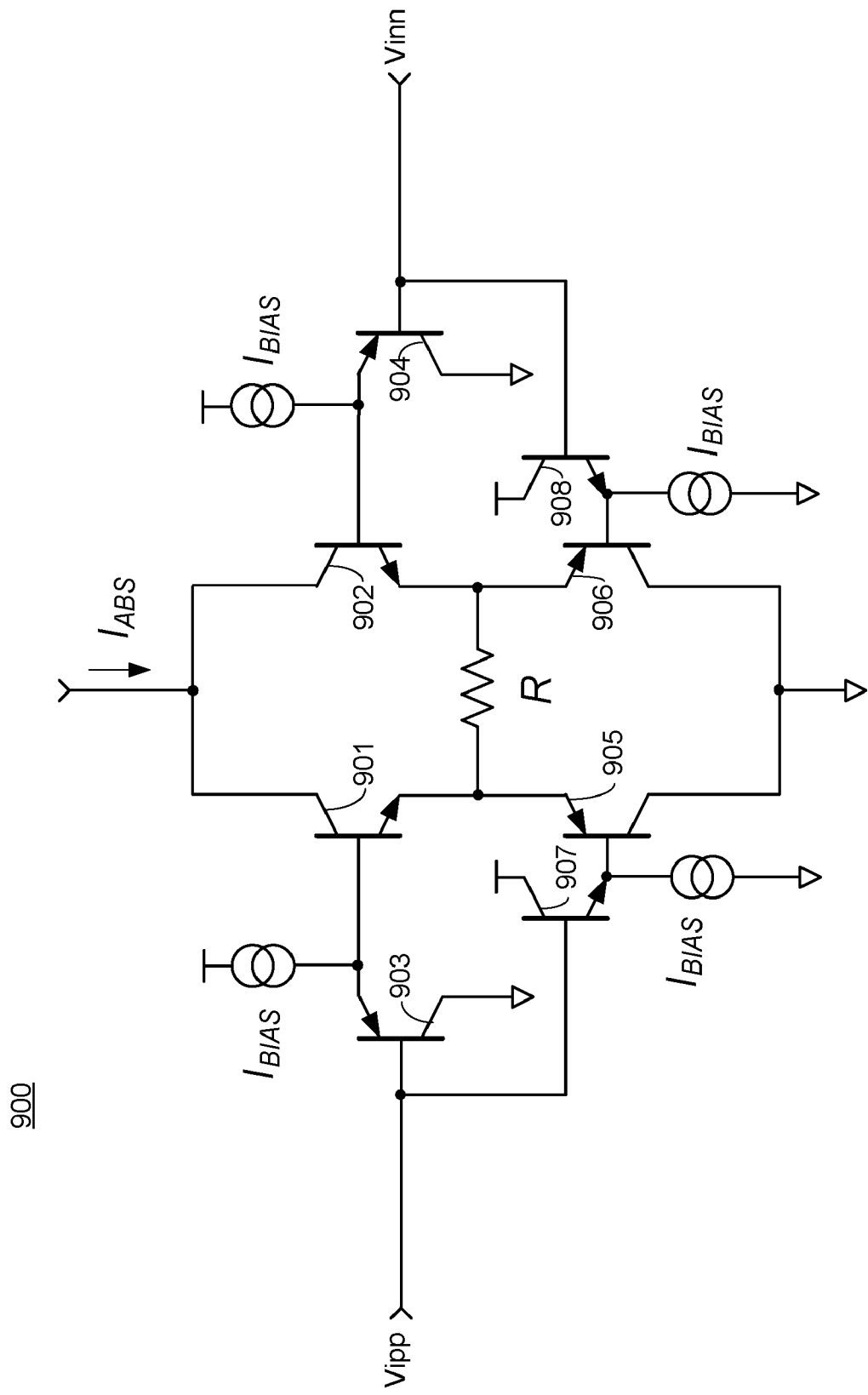

DIFFERENTIALLY COMPENSATED INPUT PAIR

BACKGROUND

Amplifiers are used in many environments and are one of the most widely used electronic devices. Typical amplifiers receive a differential voltage and have a single output. Fully differential amplifiers may receive a differential voltage and have a differential output. Typically the output of the amplifier is controlled either by negative feedback, which largely determines the magnitude the voltage gain, or by positive feedback, which facilitates regenerative gain and oscillation (i.e., it attempts to keep the input constant).

FIG. 1 illustrates a front end of a fully differential amplifier 100. The amplifier may include a first transistor 101 receiving a first input voltage Vip at a positive input terminal and a second transistor 102 receiving a second input voltage Vin at a negative input terminal of the amplifier 100. The output Iout of the amplifier 100 is the difference in current between the collectors of transistors 101 and 102 (i.e., Ip−In). The output Iout is based upon the input voltages Vip and Vin and the tail current Itail present at the emitters of transistors 101 and 102. The tail current is controlled by current mirror 103. The current mirror may include a first transistor 104, controlled by a fixed current source 106, and a second transistor 105, which provides the tail current Itail to the differential transistors 101 and 102. The current mirror attempts to match the current passing through transistor 104 into transistor 105. Accordingly Itail will be approximately equal to Ibias.

When there is a large differential input voltage (i.e., when the difference between the input to the positive terminal and the negative terminal of the amplifier is large), the output of the amplifier tends to become distorted because the transconductance Gm of the input transistors in the amplifier is non-linear. FIG. 1b illustrates the output current versus the differential input voltages for the amplifier illustrated in FIG. 1a. Ideally the output current would be linear over a large range of differential input voltages, as indicated in FIG. 1b. However, because of the non-linear output current behavior of the transistors in the amplifier, the actual current output from the amplifier becomes distorted. Transconductance is the derivative of ratio of the current at the output port and the voltage at the input ports (Gm=(ΔIout/ΔVinput) of the amplifier. For the amplifier illustrated in FIG. 1a, the transconductance can be calculated using equation 1.1:

$$Gm = \left(\frac{\alpha_F \times I_{tail}}{2 \times V_T}\right)\left(1 - \tanh^2\left(\frac{V_{ip} - V_{in}}{2 \times V_T}\right)\right) \quad (1.1)$$

where $\alpha_F$ is ratio of collector current to emitter current of transistors 101 and 102 and $V_T$ is the thermal voltage of transistors 101 and 102. Because of the distortion caused by the transconductance of the amplifier at large differential input voltages the output of the amplifier becomes distorted. As seen in FIG. 1c, the transconductance Gm of the amplifier is shaped like a bell curve. Accordingly, as the differential input voltage deviates from the operating point (i.e. zero), the output of the amplifier becomes distorted.

BRIEF DESCRIPTION OF THE DRAWINGS

FIG. 2b illustrates a comparison between the output current and the input differential voltages for the amplifier illustrated in FIG. 2a;

FIG. 2c illustrates a comparison between the transconductance and the input differential voltages for the amplifier illustrated in FIG. 2a;

FIG. 7c illustrates a comparison of the output current versus the input current Vin (Vipp−Vinn) for various gain values K at a design ratios of X:1;

FIG. 7d illustrates a comparison of the normalized transconductance verses the input voltages Vin (Vip−Vin) for various gain values K at a design ratio of X:1;

FIG. 9a illustrates yet another exemplary current modulator according to one embodiment of the present invention;

FIG. 9b a comparison of the output current versus the input current (Vip−Vin) for the current modulator illustrated in FIG. 9a.

DETAILED DESCRIPTION

Embodiments of the present invention provide an input stage for an operational amplifier including a current modulator that supplies a source current in common to a pair of transistors driven by differential input signals. The source current is modulated according to the differential input signals as well. When the differential input signals are equal, the source current is at its minimum. The source current increases as the input signals deviate. Coupled with the varying conductance of the transistors, the input stage generates output currents with improved linear behavior as compared to designs with non-modulated source currents.

Figure 1B:
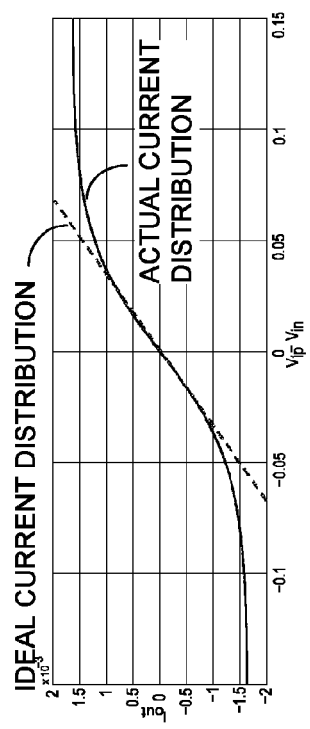
FIG. 1b illustrates a comparison between the output current and the input differential voltages for the amplifier illustrated in FIG. 1.
Figure 1C:
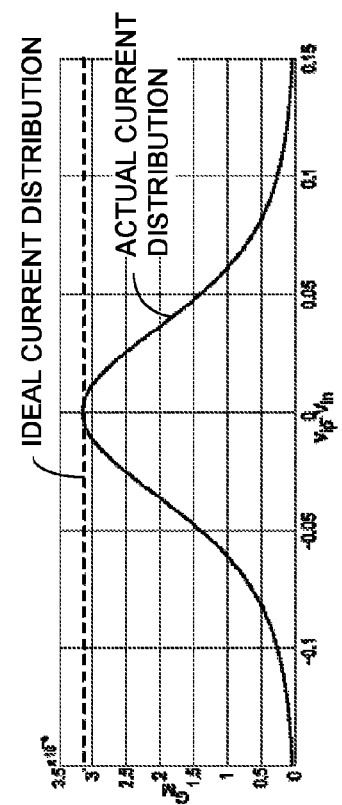
FIG. 1c is illustrates a comparison between the transconductance and the input differential voltages for the amplifier illustrated in FIG. 1.
Figure 1A:
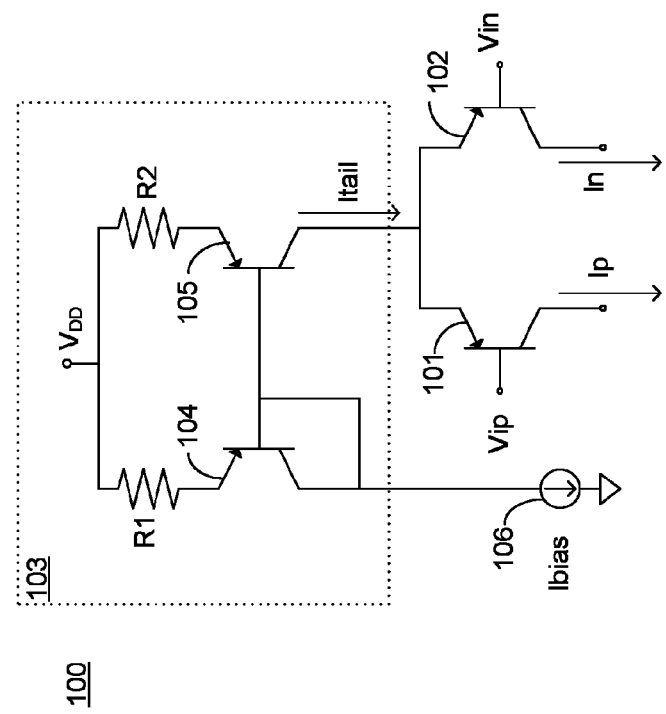
FIG. 1a is illustrates a conventional differential amplifier front end.
Figure 2A:
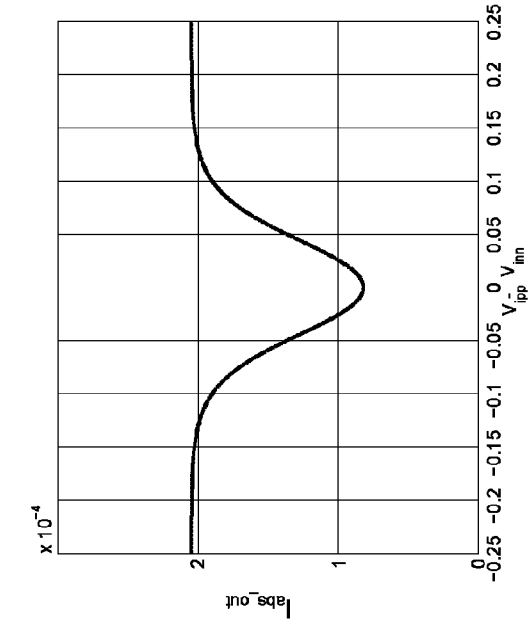
FIG. 2a illustrates an exemplary amplifier according to one embodiment of the present invention.

An exemplary embodiment of an amplifier 200 in accordance with the present invention can be seen in FIG. 2a. The amplifier 200 may include a differential amplifier 201, current modulator 207 and current mirror 204. The differential amplifier 201 may include a first transistor 202 receiving a first input voltage Vip and a second transistor 203, matched to the first transistor 202 (i.e., having the same properties), receiving a second input voltage Vin.

The amplifier 200 may further include a current mirror 204, which may include matching transistors 205 and 206 and resistors R1 and R2. The current mirror attempts to match the current Itail to the current Iabs_out. The current Iabs_out is controlled by the current modulator 207.

Figure 2B:
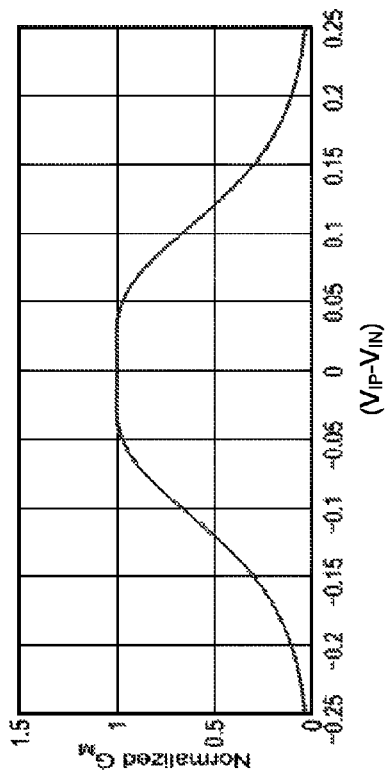

The current modulator 207 may generate an output current $I_{ABS\_OUT}$ whose magnitude varies based on the differential input voltages supplied to the amplifier. The output current $I_{ABS\_OUT}$ may follow a profile as shown in FIG. 2b. As shown, the output current may have its minimum value when the input voltages are equal to each other (Vip=Vin). However, as the input voltages become unbalanced, the output current increases. The current modulator 207 may become saturated at some point, at which point the output current reaches a maximum value. The output current from the current modulator 207 may be mirrored as the source current to the amplifier 201 via current mirror 204.

The current modulator 207 may receive input voltages Vipp and Vinn. Input voltages Vipp and Vinn may be based upon input voltages Vip and Vin, respectively. Vipp and Vinn may, for example, be modulated versions of Vip and Vin. By adjusting the voltage of Vipp and Vinn the profile of the output current $I_{ABS\_OUT}$ may be further modified, as described in further detail below.

Figure 2C:
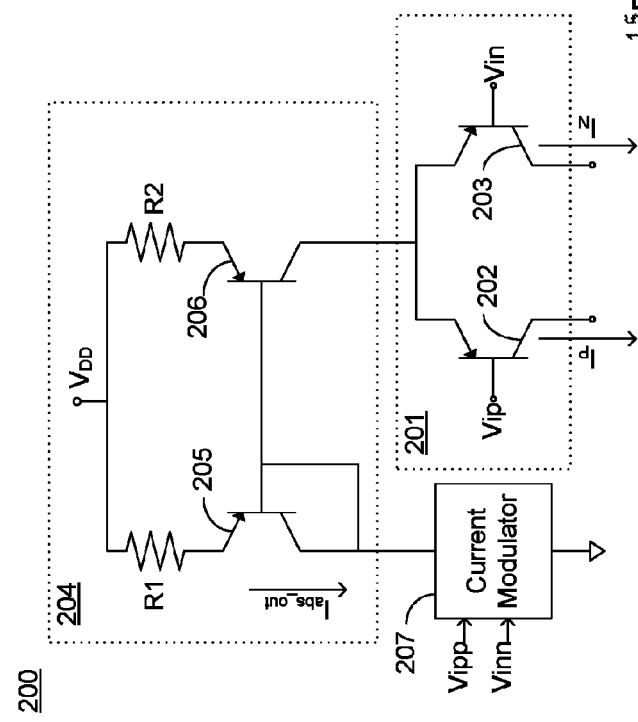

The differentially driven transistors of amplifier 201 provide further modulation to the source current. Considered in combination, the aggregate output current from the amplifier 201 (the difference of IP and IN) provides improved linearity over prior designs, as shown in FIG. 2c.

Figure 3:
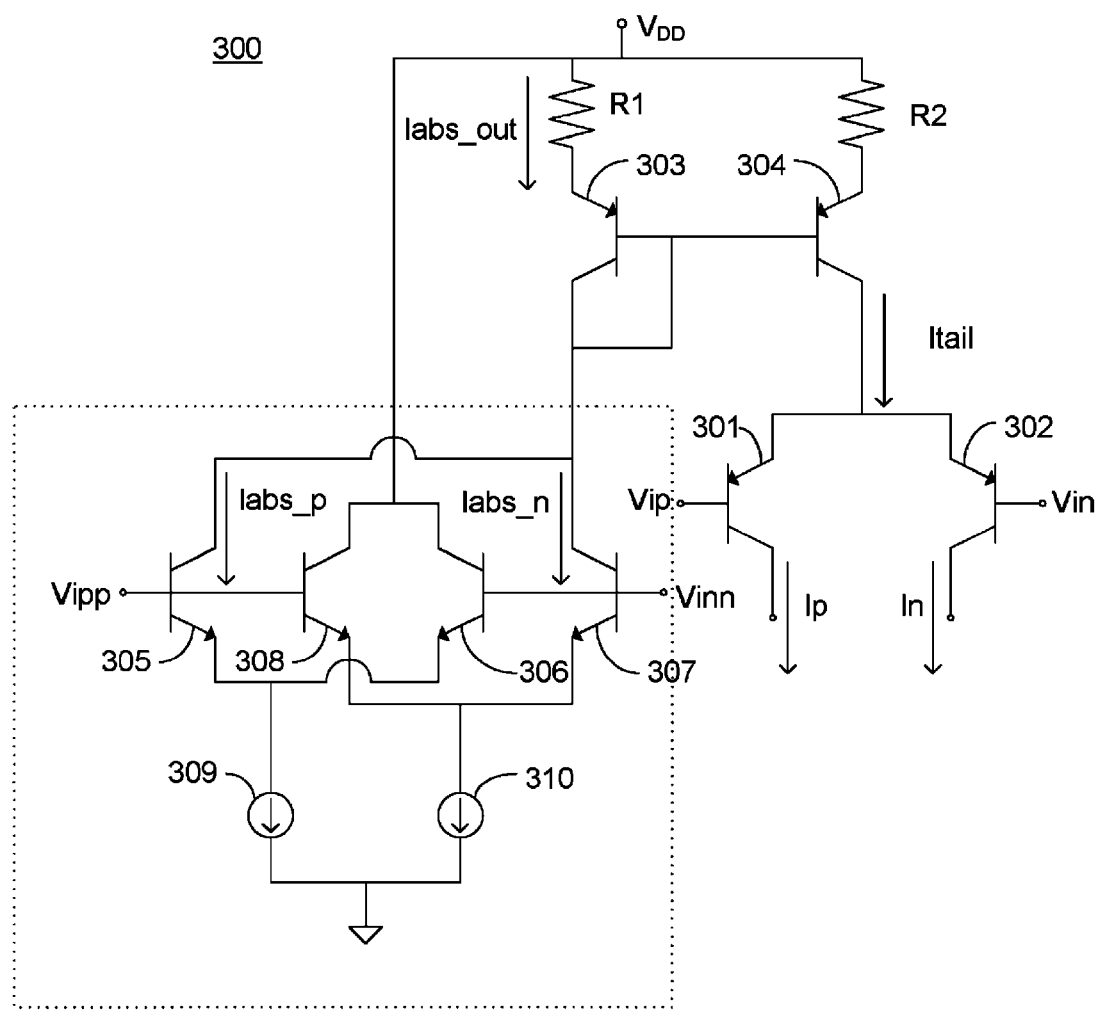
FIG. 3 illustrates another exemplary amplifier according to one embodiment of the present invention.

FIG. 3 illustrates an amplifier 300 in which the current modulator is provided as an absolute value circuit. The absolute value circuit may include transistors 305 and 307 having a same relative size and transistors 306 and 308 having a same relative size. The collectors of transistors 305 and 307 may be connected and the collectors of transistors 306 and 308 are connected. Further, the emitters of transistors 305 and 306 are connected to a current source 309 and the emitters of 307 and 308 may be connected to a current source 310. The base of transistors 305 and 308 may receive a modulated input voltage Vipp. The base of transistors 306 and 307 may receive a modulated input voltage Vinn.

The output Iout of the amplifier 300 is equal to Ip−In, where Ip is the current output from transistor 301 and In is the current output from transistor 302. Iout may also be represented by equation 1.2:

$$I_{OUT} = (I_P - I_N) = \alpha_F \times I_{TAIL} \times \tanh\left(\frac{V_{IP} - V_{IN}}{2 \times V_T}\right) \quad (1.2)$$

where $\alpha_F$ is relationship of collector current (output current) to emitter current (input current) of transistors 301 and 302 and $V_T$ is the thermal voltage of transistors 301 and 302. Accordingly, by using an absolute value circuit 207 to modulate the tail current Itail, the output Iout of amplifier 300 can be controlled.

Figure 4A:
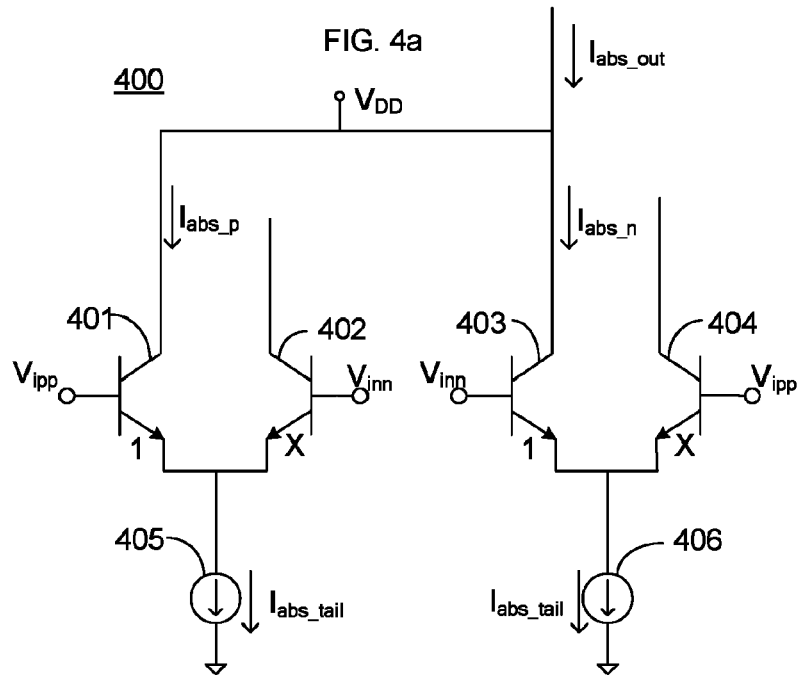
FIG. 4a illustrates an exemplary absolute value circuit in accordance with the present invention.

FIG. 4a illustrates the flow of current for an exemplary absolute value circuit 400. The absolute value circuit may include transistors 401 and 402, connected at their respective emitters and transistors 403 and 404 connected at their respective emitters. Transistors 401 and 403 may be matched transistors of a predetermined size. Further, transistors 402 and 404 may be matched and may be designed to be larger than transistors 401 and 403 by a design factor X. As seen in FIG. 4a, current Iabs_out is formed by currents Iabs_p and Iabs_n.

Figure 4B:
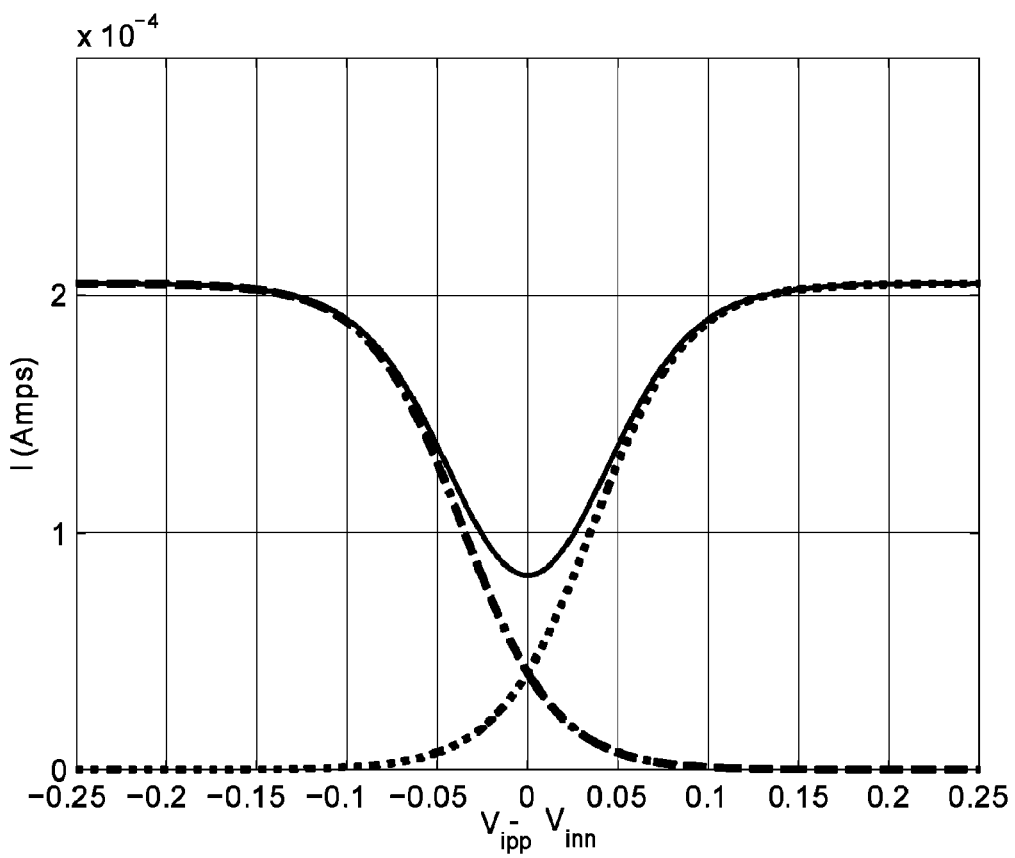
FIG. 4b illustrates a comparison of the current flowing through the absolute value circuit illustrated in FIG. 4a for various input voltages Vipp−Vinn.

As seen in FIG. 4b, when Vipp−Vinn is equal to or greater than 0.25V, transistor 401 supplies most of Iabs_out and transistor 403 supplies virtually none of Iabs_out. Conversely, when Vipp−Vinn is equal to −0.25V, transistor 403 supplies most of Iabs_out and transistor 401 supplies virtually none of Iabs_out. However, because both currents are added together by the absolute value circuit 400, Iabs_out, which is designated by the solid line in FIG. 4b, has the same current at positive or negative excursions from the operating point.

In order to improve the linearity of the transconductance Gm of the amplifier, it is preferable to have a relative minimum output current Iabs_out of the absolute value circuit at the operating point (when Vipp is approximately equal to Vinn) and a relative maximum output current at large input differential voltages. In one embodiment, this effect (i.e., shaping the transconductance of the amplifier) is achieved by changing the relative sizing of transistors 401-404. FIG. 4b, for example, illustrates the flow of current through the absolute value circuit 400 when transistors 402 and 404 are 4 times the size of transistors 401 and 403. Iabs_p and Iabs_n can be calculated using equations 1.3 and 1.4:

$$I_{abs\_p} = \alpha_F \times I_{abs\_tail}\left\{1 + \exp\left[\left(\frac{-V_{ipp} - V_{inn}}{V_T}\right) + \ln X\right]\right\}^{-1} \quad (1.3)$$

$$I_{abs\_p} = \alpha_F \times I_{abs\_tail}\left\{1 + \exp\left[-\left(\frac{-V_{ipp} - V_{inn}}{V_T}\right) + \ln X\right]\right\}^{-1}$$

where $\alpha_F$ is relationship of collector current (output current) to emitter current (input current) of transistors 401 (eq. 1.3) and 403 (eq. 1.4), $V_T$ is the thermal voltage of transistors 401 and 403 and X is the design factor (ratio of the size of transistor 401 to transistor 402 (eq. 1.3) and 403 to 404 (eq. 1.4)). Because transistor 401 is in parallel with transistors 403, the output of the absolute value circuit Iabs_out is the combination of Iabs_p and Iabs_n and may be calculated using equations 1.5:

$$I_{abs\_out} = \alpha_F I_{abs\_tail}\left[\left\{1 + \exp\left(\left(\frac{-V_{ipp} - V_{inn}}{V_T}\right) + \ln X\right)\right\}^{-1} + \left\{1 + \exp\left(-\left(\frac{-V_{ipp} - V_{inn}}{V_T}\right) + \ln X\right)\right\}^{-1}\right] \quad (1.5)$$

As seen in FIG. 4b, Iabs_out, represented by the solid line is the sum of Iabs_p (represented by the dotted line) and Iabs_n (represented by the dot-dash line) and has a relative maximum current at large differential inputs and a relative minimum current when Vipp is equal to Vinn. In one embodiment, the relative ratio X:1 of the transistors was selected to be 4:1.

Figure 5A:
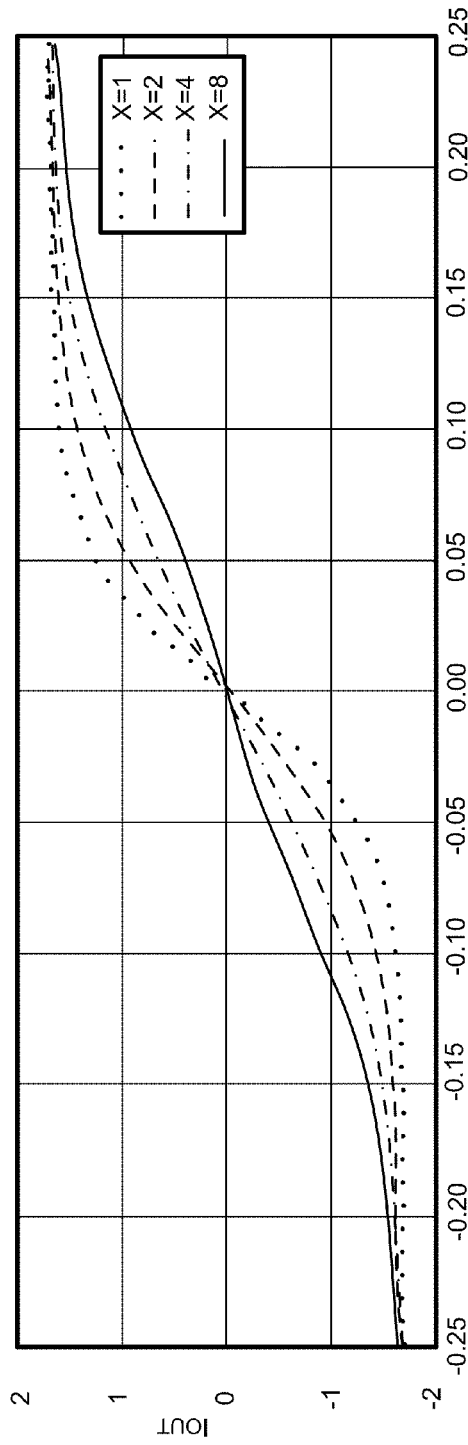
FIG. 5a illustrates a comparison of the output voltage of the amplifier illustrated in FIG. 3 over a range of input voltages Vin.

FIG. 5a illustrates the output current Iout versus the input current (Vip−Vin) for various design ratios X:1. As seen in FIG. 5a, as X increases from 1 to 4, the output current Iout becomes more linear. As X increases from 4 to 8, the absolute value circuit begins to overcorrect the transconductance.

Figure 5B:
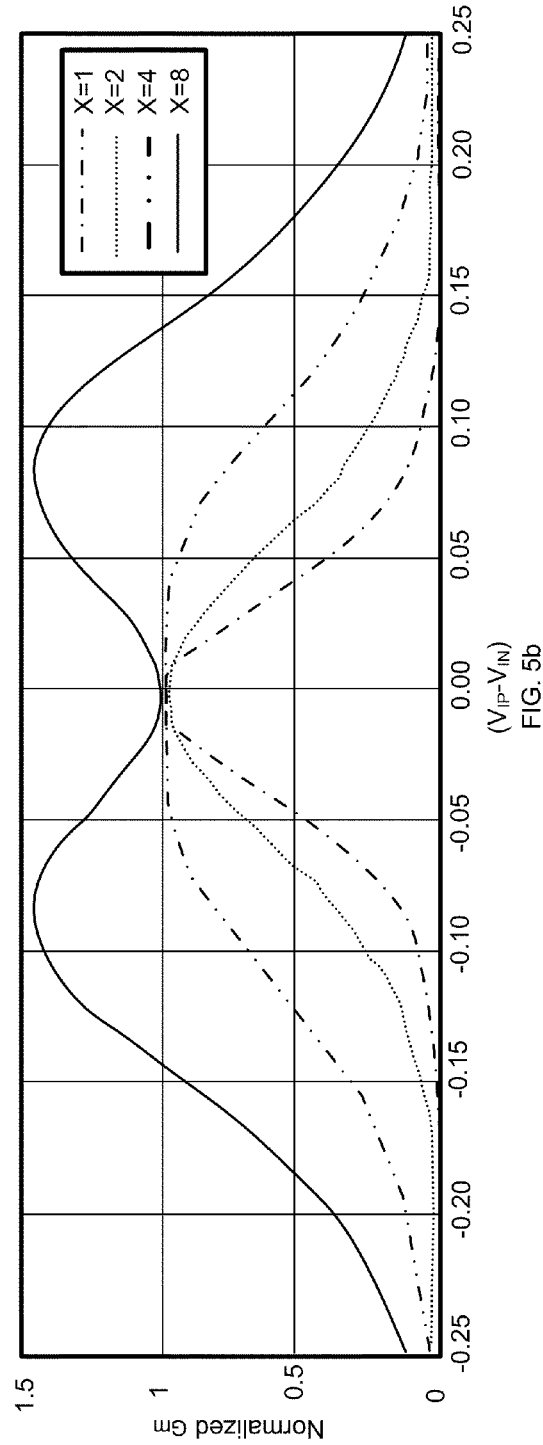
FIG. 5b illustrates a comparison of the transconductance the amplifier illustrated in FIG. 3 over a range of input voltages Vin.

FIG. 5b illustrates the normalized transconductance verses the input voltages Vin (Vip−Vin) for various design ratios X. As seen in FIG. 5a, as the design ratio increases from 1 to 4, the transconductance Gm remains around 1 for a larger range of input voltages. Ideally, the larger the voltage range for which the transconductance remains flat (i.e., at 1 in this example), the more linear the output current Iout will be over that range of input voltages.

Figure 6:
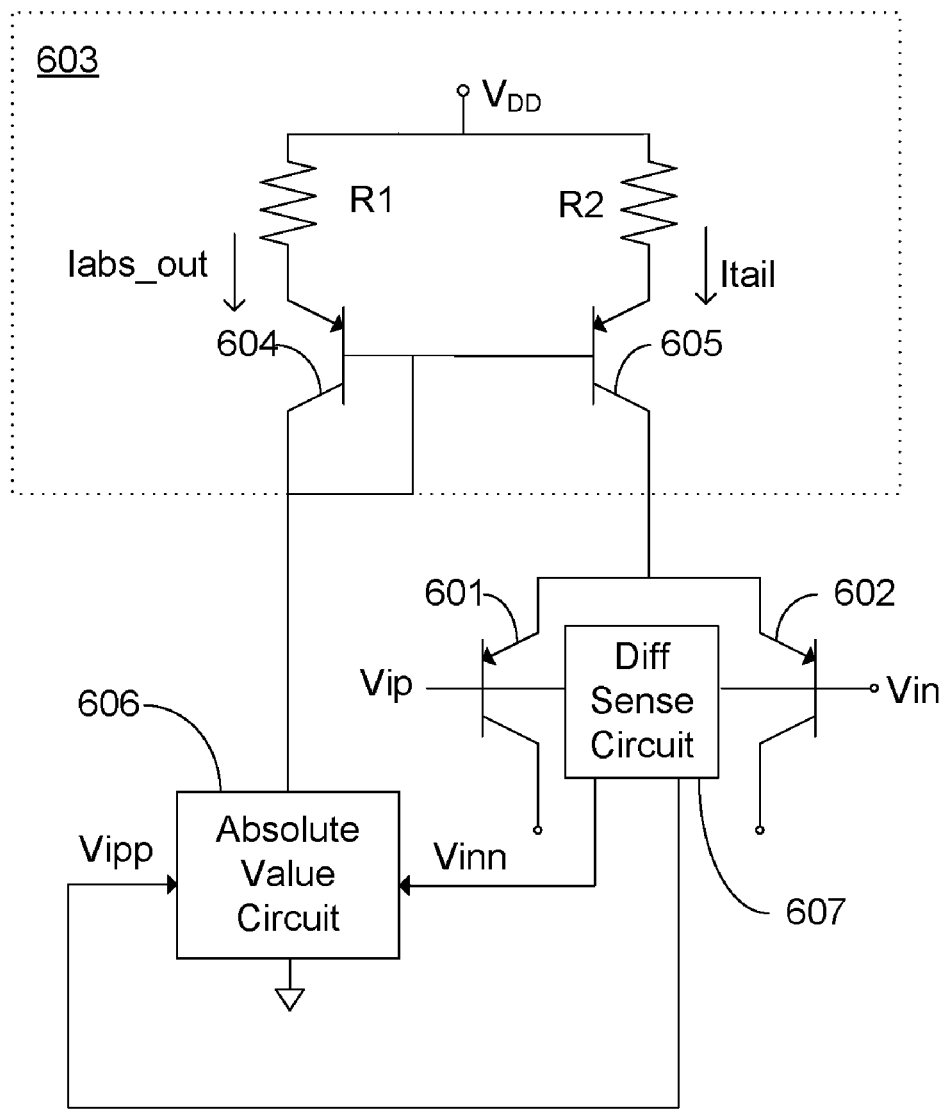
FIG. 6 illustrates yet another exemplary amplifier according to one embodiment of the present invention.

FIG. 6 illustrates another embodiment of an amplifier 600. The amplifier 600 may include including a first transistor 601 receiving a first input voltage Vip and a second transistor 602, matched to the first transistor 601 (i.e., having the same properties), receiving a second input voltage Vin. The amplifier 600 may further include a current mirror 603, which may include matching transistors 604 and 605 and resistors R1 and R2. The current mirror attempts to match the current Itail to the current Iabs_out. The current Iabs_out is controlled by the absolute value circuit 606.

The amplifier 600 may further include a differential sensing circuit 607. The differential sensing circuit may receive as its input, the input voltages Vip and Vin input into the amplifier. Based upon the input voltages, the differential sensing circuit may tune the transconductance of the amplifier to reduce distortion. This circuit may be used, for example, to modulate the input voltages Vin and Vip to provide the modulated voltages Vipp and Vinn to the current modulators discussed above. The differential voltage input to the absolute value circuit (Vipp and Vinn) is shifted, based upon a gain K, from the differential voltage input into the amplifier 600 (Vip and Vin). The modulated differential input voltage (Vipp−Vinn)=K×(Vip−Vin). The output current Iabs_out can be calculated using equations 1.6:

$$I_{abs\_out} = \alpha_F I_{abs\_tail} \left[ \left\{ 1 + \exp\left( k \left( \frac{-V_{ipp} - V_{inn}}{V_T} \right) + \ln X \right) \right\}^{-1} + \left\{ 1 + \exp\left( -k \left( \frac{-V_{ipp} - V_{inn}}{V_T} \right) + \ln X \right) \right\}^{-1} \right] \quad (1.6)$$

Figure 7A:
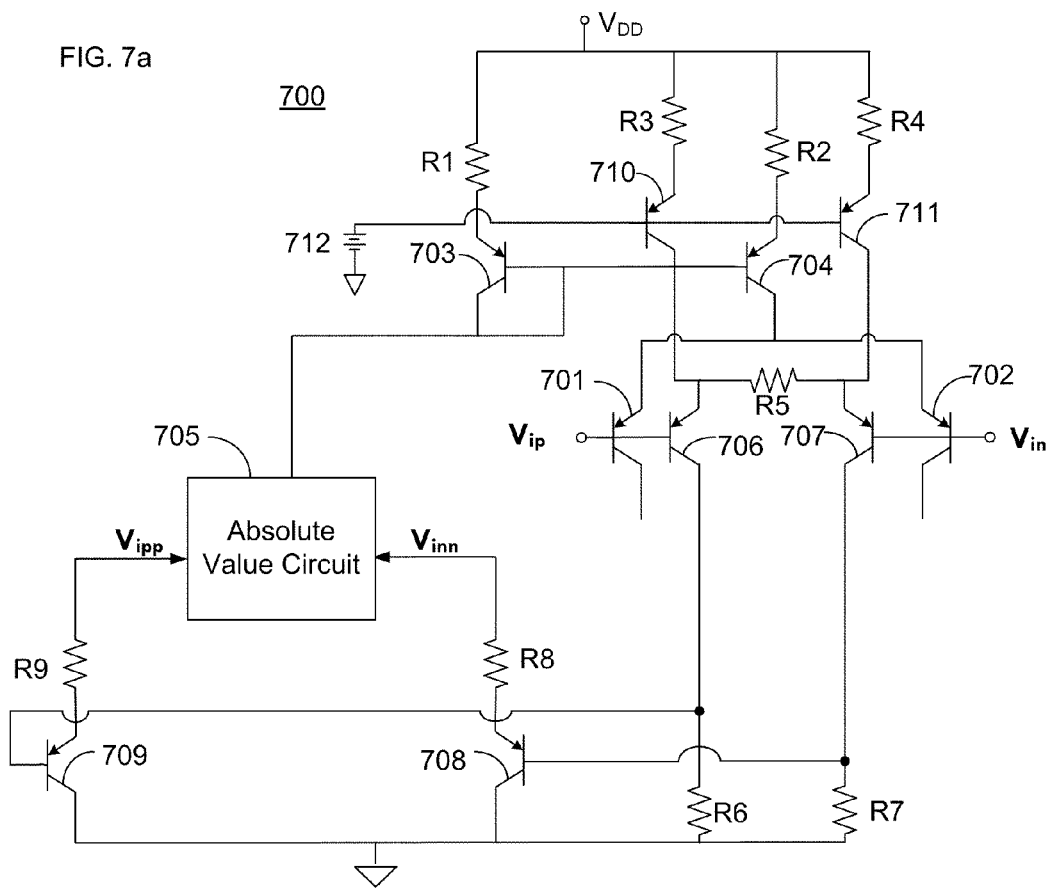
FIG. 7a illustrates a further exemplary amplifier according to one embodiment of the present invention.

FIG. 7a illustrates an amplifier 700 using an exemplary differential sensing circuit. The output of the absolute value circuit 705 is modified based upon a gain value K which is generated by the differential sensing circuit. The differential sense circuit may include transistors 706 and 707 whose collectors are connected by resister R5. The collector of transistor 706 may be connected in series with resister R6, while the collector of transistor 707 is connected in series with resister R7. The base of transistor 706 may be connected to the positive input terminal receiving voltage Vip. Conversely, the base of transistor 707 may be connected to the negative input terminal receiving voltage Vin. Resister R6 is connected to the base of transistor 709, while resister R7 is connected to the base of transistor 708.

At Vip−Vin=0, no current flows through R5. Transistors 710 and 711, which receive a bias voltage from voltage source 712, are current sources pushing equal amount of current through 706 and 707. When Vip−Vin is not equal to 0 more current is steered to 706 or 707 and this current passes through R5. The current flowing through resister R5 enters the collectors of transistors 706 and 707. The current output from transistors 706 and 707 flows through resisters R6 and R7, respectively, which then generate a voltage at the base of transistors 708 and 709. Transistor 708 passes a level shifted input Vinn into the absolute value circuit 705. Likewise, transistor 709 passes a level shifted input Vipp into the absolute value circuit 705. Vipp and Vinn are modulated based upon the gain value K. The gain value K=2×(R7/R5). The gain value K is preferably set between 0.4 and 1, however the gain value may be set beyond those reference points in certain circumstances.

Figure 7B:
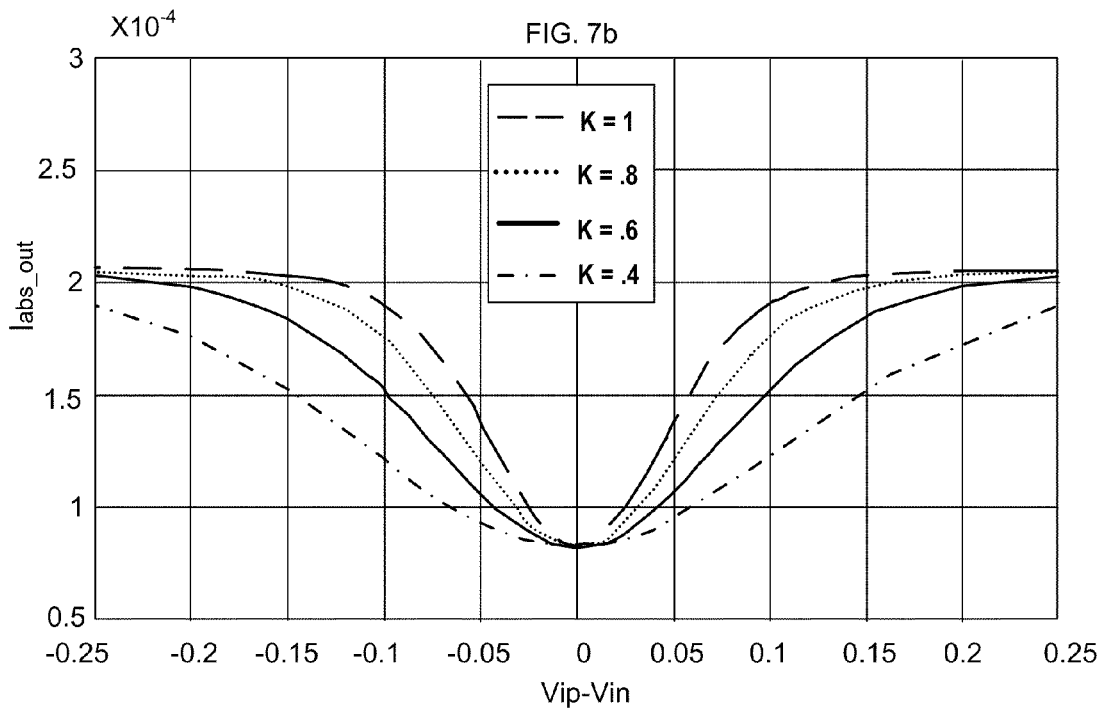
FIG. 7b illustrates a comparison of the current output from that absolute value circuit versus the input voltage to the amplifier illustrated in FIG. 7a over a range of gain values K.

FIG. 7b illustrates a comparison between the output current of the absolute value circuit Iabs_out versus the differential input voltage (Vip—Vin) at various gain values K. Note, FIG. 7b is illustrated using a transistor ratio of 4 to 1 (design factor X=4). Resistors R7 & R5 may be fixed values determined when the amplifier is manufactured, or they may be variable, allowing the shape of the output current Iabs_out to be changed based upon operating conditions.

FIG. 7c illustrates the output current Iout versus the input current Vin (Vipp−Vinn) for various gain values K at a design ratios of X:1. As seen in FIG. 7c, as K increases from 0.4 to 1, the shape of the output current Iout changes.

FIG. 7d illustrates the normalized transconductance verses the input voltages Vin (Vip−Vin) for various gain values K at a design ratio of X:1. As seen in FIG. 7d, as the design ratio increases from 0.4 to 1, the shape of the transconductance Gm changes. In the exemplary illustration in FIGS. 7c-d the gain value K is preferably set to 0.6, however, the preferable gain value K may change depending upon the design ratio X selected.

Figure 8:
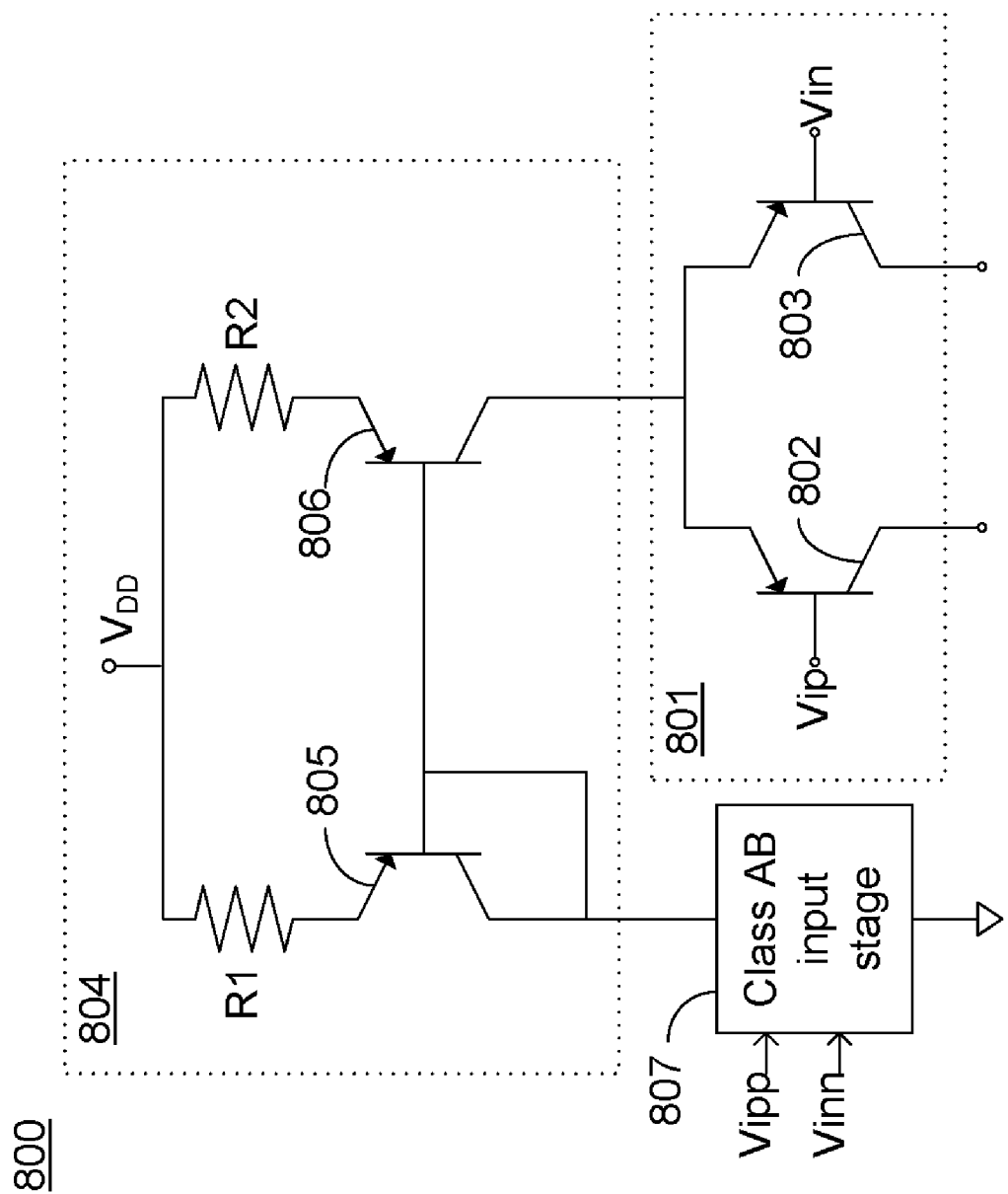
FIG. 8 illustrates another exemplary amplifier according to one embodiment of the present invention.

The above described absolute value circuits are merely an exemplary current modulator circuit which can linearize the transconductance of an amplifier. However, one of ordinary skill in the art would recognize that other circuits could accomplish a similar function. For example, a class AB differential input stage could be used FIG. 8 illustrates an amplifier 800 using a class AB differential input stage 807. The amplifier 800 may include a differential amplifier 801, class AB differential input stage 807 and current mirror 804. The differential amplifier 801 may include a first transistor 802 receiving a first input voltage Vip and a second transistor 203, matched to the first transistor 802 (i.e., having the same properties), receiving a second input voltage Vin.

The amplifier 800 may further include a current mirror 804, which may include matching transistors 805 and 806 and resistors R1 and R2. The current mirror attempts to match the current Itail to the current Iabs_out. The current Iabs_out is controlled by the class AB differential input stage 807.

The class AB differential input stage 807 may generate an output current whose magnitude varies based on the differential input voltages, for example, modulated input voltages Vipp and Vinn, supplied to the amplifier.

FIG. 9a illustrates an exemplary class AB differential input stage. The class AB differential input stage may include transistors 901 and 902 and may have their collectors connected and their emitters connected through a resistor R. The base of transistors 901 and 902 may be connected to a current source Ibias and to the emitters of transistors 903 and 904, respectively. The collectors of transistors 903 and 904 may be connected to ground. The base of transistors 903 and 904 may receive the modulated input voltages Vipp and Vinn, respectively. Transistors 907 and 908 may also receive the input modulated voltages Vipp and Vinn at their respective bases. The emitters of transistors 907 and 908 may be connected to the current source Ibias and may also be connected to the base of transistors 905 and 906, respectively. The emitters of transistors 905 and 906 may be connected to each other through the resistor R. The collectors of transistors 905 and 906 may be connected to ground.

Figure 9B:
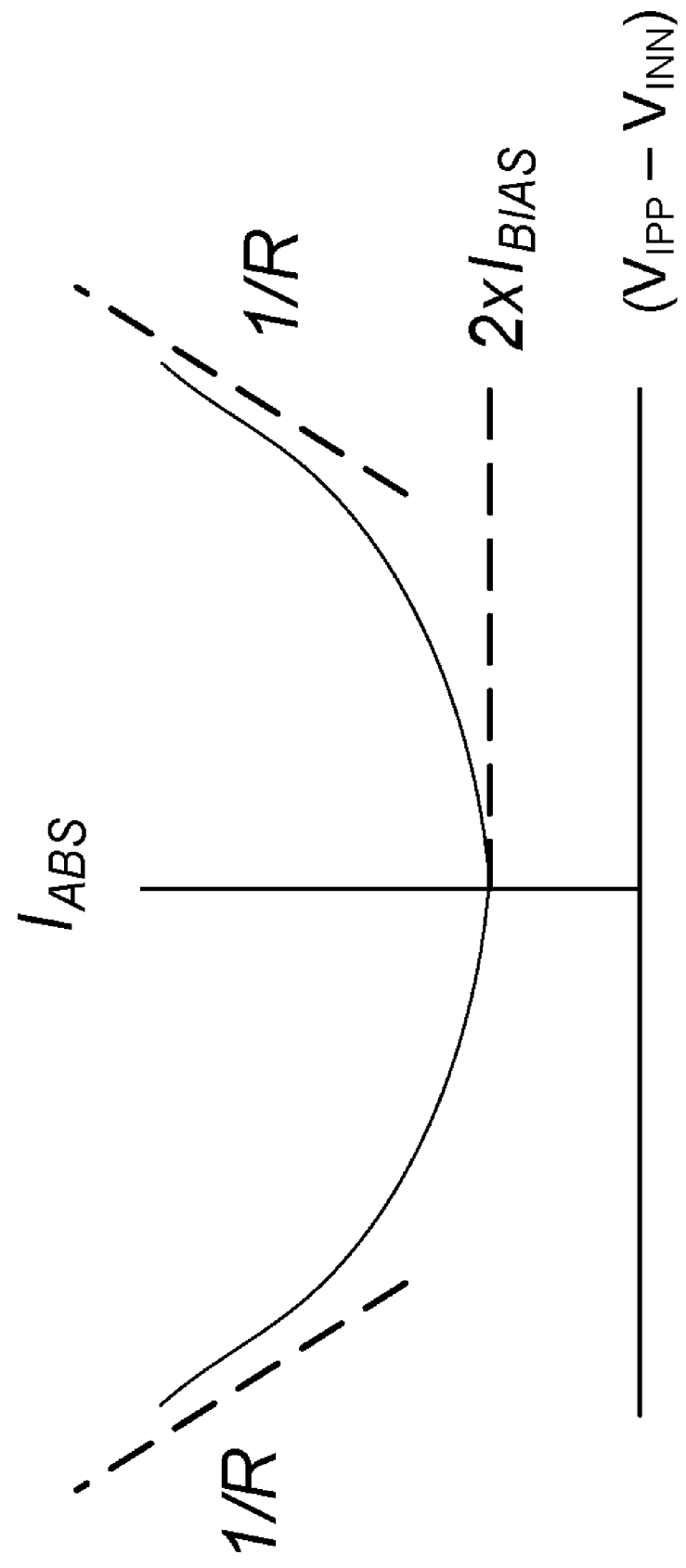

FIG. 9b illustrates a comparison between the current output Iabs from the class AB differential input stage and the input voltage Vin (i.e., Vin−Vip). As seen in FIG. 9b, as the input voltage deviates from zero (i.e., the operating point), the current output from the current modulator increases. As seen in FIG. 9b, the shape of the output current Iabs may be selectively changed by selecting the resistance of resistor R and the current of the current source Ibias.

Transistors 901, 903, 905 and 907 may form half of the class AB differential input stage, while transistors 902, 904, 906 and 908 may form the other half. Each half of the class AB differential input stage may attempt to force the input voltage (i.e., Vip or Vin) to the emitters of transistors 901, 905, 902 and 906, respectively. Since the emitters of transistors 901, 905, 902 and 906 are connected through resistor R, the difference in voltage Vip−Vin will be forced across the resistor R. The difference between the input voltages, divided by the resistance of resistor R will be equal to the output current Iabs, which is used to modulate the tail current of the amplifier.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:

1. A transconductance input stage for an amplifier comprising:
    a pair of transistors, each of the transistors coupled to one of a pair of input differential voltage signals and that each provide a current signal to a respective output terminal of the input stage in response to the input differential voltage signals,
    a current source, also coupled to the pair of input differential voltage signals, to generate a tail current modulated by the input differential voltage signals, the tail current generated at a minimum level when the input differential voltage signals are balanced, the tail current generated at higher levels when the input differential voltage signals become unbalanced and having a substantially continuous and differentiable relationship as the input differential voltage signals become unbalanced in comparison to when the input differential voltage signals are balanced,
    wherein the tail current is input to the pair of transistors and output as a differential current signal by the respective transistors.

2. The input stage for an amplifier of claim 1, wherein the minimum level is ⅔ of a maximum level.

3. A transconductance input stage for an amplifier comprising:
    a pair of transistors, each of the transistors coupled to one of a pair of input differential voltage signals and that each provide a current signal to a respective output terminal of the input stage in response to the input differential voltage signals,
    a current source, also coupled to the pair of input differential voltage signals, to generate a tail current modulated by the input differential voltage signals, the tail current generated at a minimum level when the input differential voltage signals are balanced, the tail current generated at higher levels when the input differential voltage signals become unbalanced and having a substantially continuous and differentiable relationship as the input differential voltage signals become unbalanced in comparison to when the input differential voltage signals are balanced, and
    a differential sensing circuit, sensing the input differential voltage signals, wherein the differential sensing circuit shifts the input differential voltage signals received by the pair of transistors,
    wherein the tail current is input to the pair of transistors and output as a differential current signal by the respective transistors.

4. An amplifier system, comprising:
    an amplifier driven by a differential input voltage with inputs for a tail current of the amplifier, and having a pair of output terminals for outputting current signals; and
    a current absolute value circuit driven by differential potentials comprising:
        a first pair of transistors modulating the tail current of the amplifier when a differential input voltage goes high; and
        a second pair of transistors modulating the tail current of the amplifier when a differential input voltage goes low.

5. The amplifier of claim 4, wherein when the amplifier receives a large positive or negative differential input voltage, the current absolute value circuit provides a maximum tail current to the amplifier; and
    when the amplifier receives a differential input voltage near an operating point, the absolute value circuit provides a minimum tail current to the amplifier.

6. The amplifier of claim 5, wherein the minimum tail current is ⅔ of the maximum tail current.

7. The amplifier of claim 4, wherein the first pair of transistors of the current absolute value circuit comprises a first transistor and a second transistor and the second pair of transistors of the current absolute value circuit comprises a third transistor and a fourth transistor, wherein the first and third transistors are of a first transistor size and the second and fourth transistors are of a second transistor size.

8. The amplifier of claim 7, wherein the second transistor size is greater than the first transistor size.

9. The amplifier of claim 4, further comprising:
    a differential sensing circuit, sensing the differential input voltage,
    wherein the differential sensing circuit level shifts the differential potentials received by the current absolute value circuit.

10. The amplifier of claim 9, wherein the differential sensing circuit has a gain value between 0.4 and 1.

11. A method of modulating a tail current in an amplifier, comprising:
    providing, for a large positive or negative differential input voltage, a maximum tail current to the amplifier;
    providing, for a differential input voltage near an operating point of the amplifier, a minimum tail current to the amplifier, wherein the maximum or minimum tail current is a mirrored version of a current signal generated from the differential input voltage and the tail current has a substantially continuous and differentiable relationship when the differential voltage signals are unbalanced in comparison to when the differential voltage signals are balanced; and
    outputting, as an output signal, differential current signals the sum of which equal the tail current.

12. The method of claim 11, wherein the minimum tail current is ⅔ of the maximum tail current.

13. A transconductance input stage for an amplifier comprising:
    a pair of transistors, each of the transistors coupled to one of a pair of input differential voltage signals and that each provide a current signal to a respective output terminal of the input stage in response to the input differential voltage signals, and
    a current source, also coupled to the pair of input differential voltage signals, to generate a tail current modulated by the input differential voltage signals, the tail current generated at a minimum level when the input differential voltage signals are balanced, the tail current generated at higher levels when the input differential voltage signals become unbalanced and having a substantially continuous and differentiable relationship as the input differential voltage signals become unbalanced in comparison to when the input differential voltage signals are balanced, wherein the tail current is input to the pair of transistors and output as a differential current signal by the respective transistors, and wherein the current source comprises:
    a current summing circuit to generate a modulated bias current in response to the differential input signals, and
    a current mirror to provide the generated tail current in response to the modulated bias current.

14. The transconductance input stage of claim 3, wherein the differential sensing circuit for applying shifted differential voltage signals to the current source for tuning the transconductance of the amplifier.

15. The amplifier system of claim 4, comprising:
a current mirror that supplies the modulated tail current to the amplifier in response to the current generated by the current absolute value circuit.

16. The amplifier system of claim 4, comprising:
wherein the tail current is substantially continuous and differentiable when the differential voltage signals are balanced in comparison to when the differential voltage signals are unbalanced.

* * * * *